United States Patent
Ito et al.

(10) Patent No.: US 9,469,761 B2
(45) Date of Patent: Oct. 18, 2016

(54) LIQUID CRYSTAL POLYESTER-CONTAINING LIQUID COMPOSITION

(75) Inventors: Toyonari Ito, Tsukuba (JP); Changbo Shim, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1007 days.

(21) Appl. No.: 13/337,725

(22) Filed: Dec. 27, 2011

(65) Prior Publication Data
US 2012/0183697 A1    Jul. 19, 2012

(30) Foreign Application Priority Data
Jan. 17, 2011    (JP) ................. 2011-007131

(51) Int. Cl.
| | |
|---|---|
| C08L 83/10 | (2006.01) |
| C08L 67/00 | (2006.01) |
| C08J 5/04 | (2006.01) |
| C08L 67/03 | (2006.01) |
| C08J 5/18 | (2006.01) |
| C08J 5/24 | (2006.01) |
| C08G 63/60 | (2006.01) |
| C08L 69/00 | (2006.01) |
| C08L 83/04 | (2006.01) |
| H05K 1/03 | (2006.01) |
| C08L 83/12 | (2006.01) |

(52) U.S. Cl.
CPC .............. *C08L 67/00* (2013.01); *C08G 63/60* (2013.01); *C08J 5/04* (2013.01); *C08J 5/18* (2013.01); *C08J 5/24* (2013.01); *C08L 67/03* (2013.01); *C08L 69/00* (2013.01); *C08L 83/04* (2013.01); *H05K 1/0326* (2013.01); *C08J 2367/00* (2013.01); *C08L 83/10* (2013.01); *C08L 83/12* (2013.01); *H05K 2201/0141* (2013.01)

(58) Field of Classification Search
USPC ........................................ 427/64
See application file for complete search history.

(56) References Cited

U.S. PATENT DOCUMENTS

| | | | |
|---|---|---|---|
| 2002/0049270 A1 | 4/2002 | Okamoto et al. | |
| 2004/0171788 A1* | 9/2004 | Satoh et al. | 528/305 |
| 2004/0210032 A1 | 10/2004 | Okamoto et al. | |
| 2005/0009983 A1* | 1/2005 | Itakura et al. | 524/589 |
| 2005/0276975 A1* | 12/2005 | Katagiri et al. | 428/357 |
| 2006/0051549 A1* | 3/2006 | Mano | 428/40.1 |
| 2007/0092709 A1 | 4/2007 | Okamoto et al. | |

FOREIGN PATENT DOCUMENTS

| | | |
|---|---|---|
| CN | 101173147 A | 5/2008 |
| JP | H06-279598 A | 10/1994 |
| JP | H6279598   * | 10/1994 |
| JP | 2002-329422 A | 11/2002 |
| JP | 2003-016846 A | 1/2003 |
| JP | 2004-315678 A | 11/2004 |
| JP | 2005-342980 A | 12/2005 |
| JP | 2007-146139 A | 6/2007 |

OTHER PUBLICATIONS

JP H6-279598, machine translation, 1994.*
Office Action issued Jul. 30, 2014 in CN Application No. 201210009464.X.
Office Action issued Apr. 22, 2014 in JP Application No. 2011-007131.
Office Action issued Jun. 17, 2015 in TW Application No. 100145756.
Office Action issued Jan. 13, 2016 in TW Application No. 100145756.

* cited by examiner

*Primary Examiner* — Robert Vetere
(74) *Attorney, Agent, or Firm* — Panitch Schwarze Belisario & Nadel LLP

(57) ABSTRACT

An object of the present invention is to provide a liquid crystal polyester-containing liquid composition which is capable of producing a prepreg and a resin film in which surface defects are remarkably reduced even in case of drying at high temperature to remove the solvent in the production process. Disclosed Are a liquid crystal polyester-containing liquid composition comprising a liquid crystal polyester, an organic solvent, and one or more kinds of selected leveling agents, wherein the content of the leveling agent is from 0.001 to 2.0 parts by mass based on 100 parts by mass of the total amount of the liquid crystal polyester and the organic solvent; and a method for producing a resin film, which comprises applying the above-described liquid crystal polyester-containing liquid composition on a support, and then removing the solvent from the liquid crystal polyester-containing liquid composition on the support at 50° C. or higher.

11 Claims, No Drawings

LIQUID CRYSTAL POLYESTER-CONTAINING LIQUID COMPOSITION

BACKGROUND OF THE INVENTION (1) Field of the Invention

The present invention relates to a liquid crystal polyester-containing liquid composition which contains a liquid crystal polyester, an organic solvent and a leveling agent, a method for producing a resin film from the liquid crystal polyester-containing liquid composition, and a method for producing a liquid crystal polyester-impregnated fiber sheet from a liquid crystal polyester-containing liquid composition.

(2) Description of Related Art

A liquid crystal polyester has become of major interest as an electronic substrate material since it exhibits excellent high frequency characteristics and low hygroscopicity. Particularly a solution composition containing a liquid crystal polyester including a structural unit derived from an aromatic amine derivative, and an organic solvent is capable of producing a liquid crystal polyester film having small anisotropy by flow-casting on a support and removing the solvent from the flow-cast product, and is therefore excellent as a material of a film for electronic components (see, for example, JP-A-2004-315678 or JP-A-2005-342980)

On the other hand, the liquid composition containing a resin optionally contains various additives such as a coupling agent, a leveling agent, a defoamer, an ultraviolet absorber and a flame retardant, a coloring pigment or the like. Among these additives, the leveling agent is added while expecting that a surface of a resin film formed from a resin-containing liquid composition or a surface of a fiber sheet obtained by impregnating with a resin-containing liquid composition are modified. Similar to the other resin-containing liquid compositions, general description such as addition of a leveling agent is disclosed in a liquid composition containing a liquid crystal polyester (see, for example, JP-A-2002-329422 or JP-A-2003-16846). However, there is no specific description with respect to a compound to be used as a leveling agent, the addition amount thereof, the obtained effects and the like.

In the production process of a liquid crystal polyester-impregnated fiber sheet or film obtained using a liquid composition composed of a conventional liquid crystal polyester and solvent, the solvent is removed by drying at a high temperature so as to increase productivity. However, there is a problem that surface appearance becomes worse due to a decrease in solution viscosity and rapid volatilization of the solvent in case of drying at a high temperature.

SUMMARY OF THE INVENTION

Thus, an object of the present invention is to provide a liquid crystal polyester-containing liquid composition which can produce a prepreg (a resin-impregnated fiber sheet) or a resin film in which surface defects are remarkably reduced even in case of drying at a high temperature so as to remove the solvent in the production process.

The present inventors have intensively studied so as to achieve the above object and found that it is possible to obtain a liquid composition, which gives a prepreg or film in which surface defects do not occur even in case of drying at a high temperature, by adding a specific kind of leveling agent within a specific concentration range to a liquid composition containing a liquid crystal polyester and a solvent, and thus the present invention has been completed.

Specifically, a liquid crystal polyester-containing liquid composition of the present invention comprises a liquid crystal polyester, an organic solvent, and one or more kinds of leveling agents selected from the group consisting of a polyether-modified polydimethylsiloxane, a fluorine-modified polymer and a polyester-modified polydimethylsiloxane, wherein the content of the leveling agent is from 0.001 to 2.0 parts by mass based on 100 parts by mass of the total amount of the liquid crystal polyester and the organic solvent.

In the liquid crystal polyester-containing liquid composition of the present invention, the liquid crystal polyester includes a repeating unit represented by the following formula (1), a repeating unit represented by the following formula (2) and a repeating unit represented by the following formula (3):

$$-O-Ar^1-CO-, \quad (1)$$

$$-CO-Ar^2-CO-, \text{ and} \quad (2)$$

$$-X-Ar^3-Y- \quad (3)$$

wherein $Ar^1$ represents a phenylene group, a naphthylene group or a biphenylylene group; $Ar^2$ and $Ar^3$ each independently represents a phenylene group, a naphthylene group, a biphenylylene group or a group represented by the following formula (4); X and Y each independently represents an oxygen atom or an imino group; and hydrogen atoms existing in the group represented by $Ar^1$, $Ar^2$ or $Ar^3$ each independently may be substituted with a halogen atom, an alkyl group or an aryl group, and

$$-Ar^4-Z-Ar^5- \quad (4)$$

wherein $Ar^4$ and $Ar^5$ each independently represents a phenylene group or a naphthylene group; and Z represents an oxygen atom, a sulfur atom, a carbonyl group, a sulfonyl group or an alkylidene group.

In such a case, it is preferred that the liquid crystal polyester includes 30 to 80 mol % of a repeating unit represented by the formula (1), 10 to 35 mol % of a repeating unit represented by the formula (2), and 10 to 35 mol % of a repeating unit represented by the formula (3), based on the total amount of all repeating units constituting the liquid crystal polyester. The X and/or Y is/are preferably imino group(s).

In the liquid crystal polyester-containing liquid composition of the present invention, the organic solvent is preferably an aprotic solvent. In such a case, the aprotic solvent is preferably an aprotic solvent having no halogen atom. The aprotic solvent is also preferably an amide-based solvent.

In the liquid crystal polyester-containing liquid composition of the present invention, the content of the liquid crystal polyester is also preferably from 10 to 50% by mass based on the total amount of the liquid crystal polyester and the organic solvent.

The method for producing a resin film of the present invention is characterized by applying any one of the above-mentioned liquid crystal polyester-containing liquid compositions of the present invention on a support, and then removing a solvent from the liquid crystal polyester-containing liquid composition on the support at 50° C. or higher.

The method for producing a polyester-impregnated fiber sheet of the present invention is characterized by impregnating a fiber sheet with any one of the above-mentioned liquid crystal polyester-containing liquid compositions of the present invention, and then removing a solvent from the liquid crystal polyester-containing liquid composition in the fiber sheet at 50° C. or higher.

Use of the liquid crystal polyester-containing liquid composition of the present invention enables remarkable reduction of surface unevenness so-called orange peel even in case of drying at a high temperature in the production, and thus making it possible to produce a resin film or prepreg which is excellent in surface appearance.

DETAILED DESCRIPTION OF PREFERRED EMBODIMENTS

[Liquid Crystal Polyester-Containing Liquid Composition]

The liquid crystal polyester used in the present invention is a liquid crystal polyester which exhibits mesomorphism in a molten state, and is preferably melted at a temperature of 450° C. or lower. The liquid crystal polyester may be a liquid crystal polyester amide, a liquid crystal polyester ether, a liquid crystal polyester carbonate, or a liquid crystal polyester imide. The liquid crystal polyester is preferably a wholly aromatic liquid crystal polyester obtained by using only an aromatic compound as a raw monomer.

Typical examples of the liquid crystal polyester include those obtained by polymerization (polycondensation) of an aromatic hydroxycarboxylic acid, an aromatic dicarboxylic acid, and at least one kind of compound selected from the group consisting of an aromatic diol, an aromatic hydroxyamine and an aromatic diamine; those obtained by polymerization of plural kinds of aromatic hydroxycarboxylic acids; those obtained by polymerization of an aromatic dicarboxylic acid, and at least one kind of compound selected from the group consisting of an aromatic diol, an aromatic hydroxyamine and an aromatic diamine; and those obtained by polymerization of a polyester such as polyethylene terephthalate, and an aromatic hydroxycarboxylic acid. Herein, there may be used a polymerizable derivative thereof in place of a part or all of the aromatic hydroxycarboxylic acid, aromatic dicarboxylic acid, aromatic diol, aromatic hydroxyamine and aromatic diamine, each independently.

Examples of the polymerizable derivative of the compound having a carboxyl group such as an aromatic hydroxycarboxylic acid or aromatic dicarboxylic acid include those obtained by converting a carboxyl group into an alkoxycarbonyl group or aryloxycarbonyl group (ester); those obtained by converting a carboxyl group into a haloformyl group (acid halide); and those obtained by converting a carboxyl group into an acyloxycarbonyl group (acid anhydride). Examples of the polymerizable derivative of the compound having a hydroxyl group such as an aromatic hydroxycarboxylic acid, an aromatic diol or an aromatic hydroxyamine include those obtained by converting a hydroxyl group into an acyloxyl group through acylation (acylated product). Examples of the polymerizable derivative of the compound having an amino group such as an aromatic hydroxyamine or an aromatic diamine include those obtained by converting an amino group into an acylamino group through acylation (acylated product).

The liquid crystal polyester of the present invention preferably includes a repeating unit represented by the following formula (1) (hereinafter may be sometimes referred to as a "repeating unit (1)"), and more preferably includes the repeating unit (1), a repeating unit represented by the following formula (2) (hereinafter may be sometimes referred to as a "repeating unit (2)") and a repeating unit represented by the following formula (3) (hereinafter may be sometimes referred to as a "repeating unit (3)"):

$$—O—Ar^1—CO—, \qquad (1)$$

$$—CO—Ar^2—CO—, \text{ and} \qquad (2)$$

$$—X—Ar^3—Y— \qquad (3)$$

wherein $Ar^1$ represents a phenylene group, a naphthylene group or a biphenylylene group; $Ar^2$ and $Ar^3$ each independently represents a phenylene group, a naphthylene group, a biphenylylene group or a group represented by the following formula (4); X and Y each independently represents an oxygen atom or an imino group (—NH—); and hydrogen atoms existing in the group represented by $Ar^1$, $Ar^2$ or $Ar^3$ each independently may be substituted with a halogen atom, an alkyl group or an aryl group, and $$—Ar^4—Z—Ar^5— \qquad (4)$$

wherein $Ar^4$ and $Ar^5$ each independently represents a phenylene group or a naphthylene group; and Z represents an oxygen atom, a sulfur atom, a carbonyl group, a sulfonyl group or an alkylidene group.

Examples of the halogen atom include a fluorine atom, a chlorine atom, a bromine atom and an iodine atom. Examples of the alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group and an n-decyl group, and the number of carbon atoms is usually from 1 to 10. Examples of the aryl group include a phenyl group, an o-tolyl group, an m-tolyl group, a p-tolyl group, a 1-naphthyl group and a 2-naphthyl group, and the number of carbon atoms is usually from 6 to 20. When the hydrogen atom is substituted with these groups, the number thereof is independently usually 2 or less, and preferably 1 or less, respectively, every group represented by $Ar^1$, $Ar^2$ or $Ar^3$.

Examples of the alkylidene group include a methylene group, an ethylidene group, an isopropylidene group, an n-butylidene group and a 2-ethylhexylidene group, and the number of carbon atoms is usually from 1 to 10.

The repeating unit (1) is a repeating unit derived from a predetermined aromatic hydroxycarboxylic acid. The repeating unit (1) is preferably a repeating unit in which $Ar^1$ is a p-phenylene group (a repeating unit derived from a p-hydroxybenzoic acid), or a repeating unit in which $Ar^1$ is a 2,6-naphthylene group (a repeating unit derived from 6-hydroxy-2-naphthoic acid).

The repeating unit (2) is a repeating unit derived from a predetermined aromatic dicarboxylic acid. The repeating unit (2) is preferably a repeating unit in which $Ar^2$ is a p-phenylene group (a repeating unit derived from terephthalic acid), a repeating unit in which $Ar^2$ is a m-phenylene group (a repeating unit derived from isophthalic acid), a repeating unit in which $Ar^2$ is a 2,6-naphthylene group (a repeating unit derived from 2,6-naphthalenedicarboxylic acid), or a repeating unit in which $Ar^2$ is a diphenylether-4,4'-diyl group (a repeating unit derived from diphenylether-4,4'-dicarboxylic acid).

The repeating unit (3) is a repeating unit derived from a predetermined aromatic diol, an aromatic hydroxylamine or an aromatic diamine. The repeating unit (3) is preferably a repeating unit in which $Ar^3$ is a p-phenylene group (a repeating unit derived from hydroquinone, p-aminophenol or p-phenylenediamine), or a repeating unit in which $Ar^3$ is a 4,4'-biphenylylene group (a repeating unit derived from 4,4'-dihydroxybiphenyl, 4-amino-4'-hydroxybiphenyl or 4,4'-diaminobiphenyl).

The content of the repeating unit (1) is usually 30 mol % or more, preferably 30 to 80 mol %, more preferably from 30 to 60 mol %, and still more preferably from 30 to 40 mol %, based on the total amount of all repeating units (value in which the mass of each repeating unit constituting a liquid crystal polyester is divided by a formula weight of each repeating unit thereof to determine the amount (mol) corresponding to the amount of a substance of each repeating unit, and then the obtained amounts are totaled). The content of the repeating unit (2) is usually 35 mol % or less, preferably from 10 to 35 mol %, more preferably from 20 to 35 mol %, and still more preferably from 30 to 35 mol %, based on the total amount of all repeating units. The content of the repeating unit (3) is usually 35 mol % or less, preferably from 10 to 35 mol %, more preferably from 20 to 35 mol %, and still more preferably from 30 to 35 mol %, based on the total amount of all repeating units. As the content of the repeating unit (1) increases, heat resistance as well as strength and rigidity are likely to be improved. However, when the content is too large, solubility in the solvent is likely to decrease.

A ratio of the content of the repeating unit (2) to the content of the repeating unit (3) is usually from 0.9/1 to 1/0.9, preferably from 0.95/1 to 1/0.95, and more preferably from 0.98/1 to 1/0.98, in terms of [content of the repeating unit (2)]/[content of the repeating unit (3)] (mol/mol).

The liquid crystal polyester may include two or more kinds of each of the repeating units (1) to (3), independently. The liquid crystal polyester may include the repeating unit other than the repeating units (1) to (3), and the content thereof is usually 10 mol % or less, and preferably 5 mol % or less, based on the total amount of all repeating units.

The liquid crystal polyester preferably includes, as the repeating unit (3), a repeating unit in which X and/or Y is/are imino group(s), that is, a repeating unit derived from a predetermined aromatic hydroxylamine and/or a repeating unit derived from aromatic diamine, because of excellent solubility in a solvent, and more preferably includes, as the repeating unit (3), only a repeating unit in which X and/or Y is/are imino group(s).

The liquid crystal polyester is preferably produced by melt-polymerizing a raw monomer corresponding to a repeating unit constituting the liquid crystal polyester, and subjecting the obtained polymer (prepolymer) to solid phase polymerization. Whereby, it is possible to produce a high molecular weight liquid crystal polyester having high heat resistance as well as high strength and rigidity with satisfactory operability. The melt polymerization may be carried out in the presence of a catalyst. Examples of the catalyst used in the melt polymerization include metal compounds such as magnesium acetate, stannous acetate, tetrabutyl titanate, lead acetate, sodium acetate, potassium acetate and antimony trioxide; and nitrogen-containing heterocyclic compounds such as 4-(dimethylamino)pyridine and 1-methylimidazol; and nitrogen-containing heterocyclic compounds are preferably used.

The flow initiation temperature of the liquid crystal polyester is preferably 250° C. or higher, more preferably from 250 to 350° C., still more preferably from 260 to 330° C. As the flow initiation temperature increases, heat resistance as well as strength and rigidity are likely to be improved. However, the flow initiation temperature is too high, solubility in the solvent is likely to decrease and viscosity of the liquid composition is likely to increase.

The flow initiation temperature is also called a flow temperature and means a temperature at which a melt viscosity becomes 4,800 Pa·s (48,000 poise) when a liquid crystal polyester is melted while heating at a heating rate of 4° C./rain under a load of 9.8 MPa (100 kg/cm²) and extruded through a nozzle having an inner diameter of 1 mm and a length of 10 mm using a capillary rheometer, and the flow initiation temperature serves as an index indicating a molecular weight of the liquid crystal polyester (see "Liquid Crystalline Polymer—Synthesis, Molding, and Application" edited by Naoyuki Koide, page 95, published by CMC Publishing CO., LTD., issued on Jun. 5, 1987).

The liquid crystal-containing liquid composition of the present invention contains, in addition to a liquid crystal polyester, an organic solvent. The organic solvent to be used in the liquid crystal-containing liquid composition of the present invention is appropriately selected from those which can dissolve the liquid crystal polyester used, specifically a solvent which can dissolve in the concentration ([liquid crystal polyester]/[liquid crystal polyester+organic solvent]×100) of 1% by mass or more at 50° C.

Examples of the organic solvent include halogenated hydrocarbons such as dichloromethane, chloroform, 1,2-dichloroethane, 1,1,2,2,-tetrachloroethane and o-dichlorobenzene; phenol halides such as p-chlorophenol, pentachlorophenol and pentafluorophenol; ethers such as diethylether, tetrahydrofuran and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amide-based solvents (organic solvents having an amide bond) such as N,N-dimethylformamide, N,N-dimethylacetamide and N-methylpyrrolidone, urea compounds such as tetramethylurea; nitro compound such as nitromethane and nitrobenzene; sulfur compounds such as dimethyl sulfoxide and sulfolane; and phosphorus compounds such as hexamethylphosphoric acid amide and tri-n-butylphosphoric acid. Two or more kinds of these organic solvents may be used in combination.

The organic solvent is preferably a solvent containing, as a main component, an aprotic compound, and particularly an aprotic compound having no halogen atom, since the solvent is easily handled because of low corrosion resistance. The content of the aprotic compound in the entire solvent is preferably from 50 to 100% by mass, more preferably from 70 to 100% by mass, and still more preferably from 90 to 100% by mass. It is preferred to use, as the aprotic compound, amide-based solvents such as N,N-dimethylformamide, N,N-dimethylacetamide and N-methyl pyrrolidone since it is easy to dissolve the liquid crystal polyester, and more preferably amide-based solvents having no halogen atoms.

The organic solvent is preferably a solvent containing, as a main component, a compound having a dipole moment of 3 to 5 since it is easy to dissolve the liquid crystal polyester. The content in the entire solvent of the compound having a dipole moment of 3 to 5 is preferably 50 to 100% by mass, more preferably from 70 to 100% by mass, and still more preferably from 90 to 100% by mass. It is particularly preferred to use, as the aprotic compound, a compound having a dipole moment of 3 to 5.

The organic solvent is preferably a solvent containing, as a main component, a compound having a boiling point at 1 atm of 220° C. or lower since it is easy to remove. The content in the entire solvent of the compound having a boiling point at 1 atm of 220° C. or lower is preferably from 50 to 100% by mass, more preferably from 70 to 100% by mass, and still more preferably from 90 to 100% by mass. It is preferred to use, as the aprotic compound, a compound having a boiling point at 1 atm of 220° C. or lower.

The content of liquid crystal polyester in the liquid crystal polyester-containing liquid composition is preferably from 5 to 60% by mass, more preferably from 10 to 50% by mass, and still more preferably from 15 to 45% by mass, based on the total amount of the liquid crystal polyester and organic solvent, and the content is appropriately adjusted so as to obtain a liquid composition having a desired viscosity.

The leveling agent used in the liquid crystal polyester-containing liquid composition of the present invention is composed of one or more kinds selected from the group consisting of a polyether-modified polydimethylsiloxane, a fluorine-modified polymer and a polyester-modified polydimethylsiloxane. The leveling agent may be used alone, or two or more kinds of leveling agents may be appropriately used in combination. When the liquid crystal polyester-containing liquid composition of the present invention contains at least one kind of leveling agent selected from the group consisting of a polyether-modified polydimethylsiloxane, a fluorine-modified polymer and a polyester-modified polydimethylsiloxane, it is possible to obtain a liquid composition which can give a liquid crystal polyester-impregnated fiber sheet or a resin film in which surface defects do not occur even in case of drying at a high temperature.

Those having a structure, in which a polyalkylene oxide group is introduced at the end of polydimethylsiloxane, are used as the polyether-modified polydimethylsiloxane. Those having a structure, in which a polyester group is introduced into a portion of a methyl group of dimethylsiloxane, is used as the polyester-modified polydimethylsiloxane. The polyether-modified polydimethylsiloxane and polyester-modified polydimethylsiloxane used in the present invention are preferably compounds represented by the following formula (5).

[Chemical Formula 1]

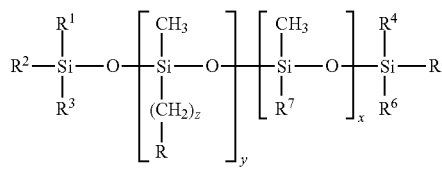

(5)

In the formula (5), $R^1$, $R^2$, $R^3$, $R^4$, $R^5$, $R^6$ and $R^7$ each independently represents H, $CH_3$, $C_2H_5$, $C_3H_7$, $OCH_3$ or $OC_2H_5$. In the present invention, it is preferred that $R^1$, $R^2$, $R^3$, $R^4$, $R^5$, $R^6$ and $R^7$ each independently represents $CH_3$, $C_2H_5$, $OCH_3$ or $OC_2H_5$, and more preferably $CH_3$ or $OC_2H_5$.

In the formula (5), x, y and z each independently represents an integer of from 1 to 20. In the present invention, it is preferred that x, y and z each independently represents an integer of from 1 to 10, and more preferably an integer of from 1 to 5.

Furthermore, in the formula (5), R is a group represented by the following formula (6) or (7).

[Chemical Formula 2]

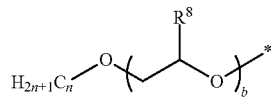

(6)

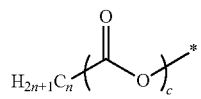

(7)

In the formula (6), $R^8$ represents a hydrogen atom, an alkyl group having 1 to 4 carbon atoms, a group containing a cation polymerizable group, or a group containing an ethylenically unsaturated group. Specific examples of the group containing a cation polymerizable group include an epoxy group, an oxetane group and the like. Specific examples of the group containing an ethylenically unsaturated group include a vinyl group, an acryloyloxy group, a methacryloyloxy group and the like. In the present invention, in the formula (6), $R^8$ is preferably a hydrogen atom or an alkyl group having 1 to 4 carbon atoms, and more preferably a hydrogen atom.

In the formulas (6) and (7), n represents an integer of from 1 to 5. In the present invention, in the formulas (6) and (7), it is preferred that n represents an integer of from 1 to 3.

b in the formula (6) and c in the formula (7) each independently represents an integer of from 1 to 20. In the present invention, in the formulas (6) and (7), it is preferred that b and c each independently represents an integer of from 1 to 10, and more preferably an integer of from 1 to 5.

Among the compound represented by the formula (5), a compound, in which $R^1$, $R^2$, $R^3$, $R^4$, $R^5$, $R^6$ and $R^7$ each independently represents $CH_3$ or $OC_2H_5$, x, y and z each independently represents an integer of from 1 to 10, and R is a group represented by the following formula (6') or (7'), is more preferable as a polyether-modified dimethylsiloxane and polyester-modified polydimethylsiloxane used in the present invention. In the following formulas (6') and (7'), n' represents an integer of from 1 to 3, and b' in the following formula (6') and c' in the following formula (7') each independently represents an integer of from 1 to 10.

[Chemical Formula 3]

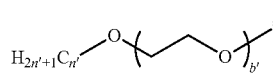

(6')

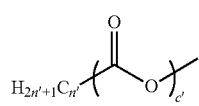

(7')

Among the compound represented by the formula (5), the compound represented by the following formula (8) is more preferably as the leveling agent used in the present invention. In the following formula (8), x', y', z', b" each independently represents an integer of from 1 to 5, and n' represents an integer of from 1 to 3.

[Chemical Formula 4]

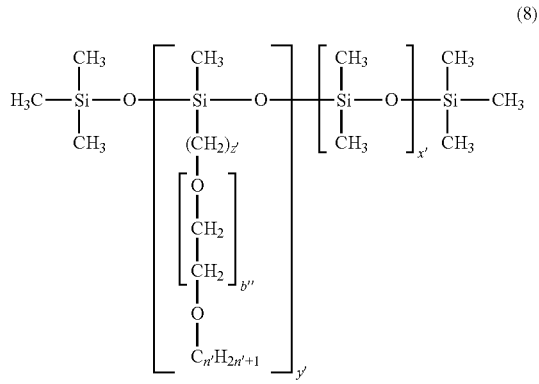

(8)

It is possible to use, as the polyether-modified polydimethylsiloxane, a commercially available polyether-modified polydimethylsiloxane. Specific examples thereof include BYK-300, BYK-306, BYK-307, BYK-330, BYK-331, BYK-333, BYK-337, BYK-341, BYK-344 and BYK-378 manufactured by BYK-Chemie Japan KK; GLANOL 410 manufactured by Kyoeisha Chemical Co. Ltd.; KF-351 manufactured by Shin-Etsu Chemical Co., Ltd.; and the like. It is also possible to use, as the polyester-modified polydimethylsiloxane, commercially available polyester-modified polydimethylsiloxanes. Specific examples thereof include BYK-310 manufactured by BYK-Chemie Japan KK; GLANOL 410 manufactured by Kyoeisha Chemical Co. Ltd.; and the like. These compounds may be used alone, or two or more kinds can be used in combination.

The fluorine-modified polymer is a polymer in which at least one hydrogen atom is substituted with a fluorine atom. The fluorine-modified polymer used in the present invention is preferably the compound represented by the following formula (9).

$$R^9-(OA^1)_d-(OA^2)_e-OR^{10} \quad (9)$$

In the formula (9), d and e each independently represents an integer of 0 or more. When d is 0, "-$(OA^1)_d$-" in the formula (9) is a single bond. When e is 0, "-$(OA^2)_e$-" in the formula (9) is a single bond. When both d and e are 0, the compound represented by the formula (9) becomes "$R^9$—$OR^{10}$". In the present invention, it is preferred that any one of d and e is 0 and the other one is an integer of 1 or more.

$A^1$ and $A^2$ each independently represents a fluoroalkylene group or an alkylene group. $A^1$ and $A^2$ may be the same or different. In the fluoroalkylene group, at least one of hydrogen atom of an alkylene group may be substituted with a fluorine atom, all hydrogen atoms may be substituted with a fluorine atom, or only one or several hydrogen atom(s) may be substituted with a fluorine atom. In the present invention, $A^1$ and $A^2$ are preferably the same or different alkylene groups, more preferably the same or different alkylene groups having 2 to 40 carbon atoms, and still more preferably the same or different alkylene groups having 4 to 20 carbon atoms.

Furthermore, $R^{10}$ represents a fluoroalkyl group. In the fluoroalkyl group, at least one hydrogen atom of an alkyl group may be substituted with a fluorine atom, all hydrogen atoms may be substituted with a fluorine atom, or only one or several hydrogen atom(s) may be substituted with a fluorine atom. In the present invention, $R^{10}$ is preferably a fluoroalkyl group having 1 to 10 carbon atoms, more preferably a fluoroalkyl group having 3 to 7 carbon atoms, and still more preferably a fluoroalkyl group having 3 to 7 carbon atoms in which all hydrogen atoms are substituted with a fluorine atom.

In the formula (9), $R^9$ is a group represented by the following formula (10), (11) or (12).

[Chemical Formula 5]

(10)

(11)

(12)

The fluorine-modified polymer used in the present invention is preferably a compound represented by the following formula (13). In the following formula (13), $R^9$ is the same as in the above-mentioned formula (9).

In the following formula (13), m is an integer of from 1 to 10. In the present invention, m is preferably an integer of from 3 to 7.

In the following formula (13), a is an integer of from 1 to 20. In the present invention, a is preferably an integer of from 2 to 10.

[Chemical Formula 6]

$$R^9\diagdown O \diagup\!\!\diagdown_a\!\!\diagup C_mF_{2m+1} \quad (13)$$

It is possible to use, as the fluorine-modified polymer, a commercially available fluoro compound. Examples of the preferable fluorine-modified polymer include F-116, F-120, F-144D, F-150, F-160, F-171, F-172, F-178K, F-179 and F-191 manufactured by Dainippon Ink and Chemicals, Incorporated; BYK-340 manufactured by BYK-Chemie Japan KK; and the like. These compounds may be used alone, or two or more kinds can be used in combination.

The content of the leveling agent in the liquid crystal polyester-containing liquid composition of the present invention is from 0.001 to 2.0 parts by mass based on 100 parts by mass of the total amount of the liquid crystal polyester and the organic solvent. When the content of the leveling agent is less than 0.001 part by mass, less effect of improving appearance is exerted. In contrast, when the content is more than 2.0 parts by mass, the effect of surface modification and the mechanical strength are reduced. The content of the leveling agent in the liquid crystal polyester-containing liquid composition of the present invention is preferably from 0.001 to 0.5 part by mass, and more preferably from 0.005 to 0.5 part by mass, based on 100 parts by mass of the total amount of the liquid crystal polyester and the organic solvent.

The liquid crystal polyester-containing liquid composition of the present invention may contain one, or two or more kinds of additive(s) other than the leveling agent. Examples of the additive include a defoamer, an antioxidant, an ultraviolet absorber, a flame retardant, a dye, a pigment and the like, and the content of the additive is preferably from 0 to 5 parts by mass based on 100 parts by mass of the liquid crystal polyester.

The liquid crystal polyester-containing liquid composition of the present invention may contain a filler as long as the effects of the present invention are not impaired. The filler may be an inorganic filler, or an organic filler, or may be both fillers. Examples of the inorganic filler include silica, alumina, titanium oxide, barium titanate, strontium titanate, aluminum hydroxide, calcium carbonate and the like. Examples of the organic filler include organic fillers such as a hardened epoxy resin, a crosslinked benzoguanamine resin and a crosslinked acrylic resin. The content of the filler is preferably from 0 to 100 parts by mass based on 100 parts by mass of the liquid crystal polyester.

The liquid crystal polyester-containing liquid composition of the present invention may contain a resin other than the liquid crystal polyester as long as the effects of the present invention are not impaired. Examples of the resin other than the liquid crystal polyester include thermoplastic resins other than the liquid crystal polyester, such as polypropylene, polyamide, polyester other than the liquid crystal polyester (non-liquid crystalline polyallylate), polyphenylene sulfide, polyetherketone, polycarbonate, polyethersulfone, polyphenyleneether and a modified product thereof, and polyetherimide; elastomers such as a copolymer of glycidyl methacrylate and polyethylene; and thermosetting resins such as a phenol resin, an epoxy resin, a polyimide resin and a cyanate resin. The content of the resin other than the liquid crystal polyester is preferably from 0 to 20 parts by mass based on 100 parts by mass of the liquid crystal polyester.

The liquid crystal polyester-containing liquid composition of the present invention can be prepared by mixing a liquid crystal polyester, an organic solvent, a leveling agent and optionally used other components, collectively or in a suitable order. The liquid crystal polyester-containing liquid composition is preferably prepared by dissolving a liquid crystal polyester in an organic solvent to obtain a liquid crystal polyester solution, and then dispersing a leveling agent in the obtained liquid crystal polyester solution. The optionally used other components may be dissolved or dispersed in an organic solvent during, before or after dissolving the liquid crystal polyester in the organic solvent, or may be dissolved or dispersed in the liquid crystal polyester solution during, before or after dispersing the leveling agent in the liquid crystal polyester solution.

It is possible to produce a resin film or a resin-impregnated fiber sheet from the liquid crystal polyester-containing liquid composition of the present invention, using a known technique, similarly to a liquid composition containing other resins. The liquid crystal polyester-containing liquid composition of the present invention may be optionally filtered with a filter or the like to remove fine foreign matters contained in the liquid composition in advance before using in the production of a resin film or a resin-impregnated fiber sheet.

The term "film" as used herein includes from a sheet-shaped ultrathin film to a thick film, and includes not only a sheet-shaped film, but also a bottle-shaped container form.

The liquid crystal polyester-impregnated fiber sheet or resin film obtained from the liquid crystal polyester-containing liquid composition of the present invention has a flat surface shape since orange peel is resolved even in case of drying at a high temperature (for example, 50° C. or higher) in the production. Therefore, the liquid crystal polyester-impregnated fiber sheet or resin film is not only excellent in surface appearance, but also has improved mechanical strength such as tensile strength. Furthermore, the liquid crystal polyester-containing liquid composition of the present invention exerts a surface modification effect by adding a small amount of a specific leveling agent. Therefore, the leveling agent thus added does not exert an adverse influence on platability when a conductor is formed from the obtained liquid crystal polyester-impregnated fiber sheet or resin film.

The liquid crystal polyester-impregnated fiber sheet or resin film obtained from the liquid crystal polyester-containing liquid composition of the present invention is not only excellent in surface appearance and tensile strength, but also excellent in original performances of the liquid crystal polyester, such as high frequency characteristics and water absorptivity. Therefore, the liquid crystal polyester-impregnated fiber sheet or resin film can be suitably used in films for electronic components such as a printed circuit board. Particularly, a resin film obtained from the liquid crystal polyester-containing liquid composition containing a liquid crystal polyester including the repeating unit (1), the repeating unit (2) and the repeating unit (3) has small anisotropy and is excellent in mechanical strength.

[Method for Production of Resin Film]

A resin film is obtained by film formation of the liquid crystal polyester-containing liquid composition of the present invention. That is, the method for producing a resin film of the present invention is characterized by applying the liquid crystal polyester-containing liquid composition of the present invention on a support, and then removing a solvent from the liquid crystal polyester-containing liquid composition on the support at 50° C. or higher.

Examples of the method of applying the liquid crystal polyester-containing liquid composition on the support include a method of flow cast-applying the composition in a film shape on a support using various means such as a roller coating method, a dip coating method, a spray coating method, a spinner coating method, a curtain coating method, a slot coating method or a screen printing.

The solvent is removed from the liquid crystal polyester-containing liquid composition on the support by heating the support on which the liquid crystal polyester-containing liquid composition is applied at 50° C. or higher, and preferably 80° C. or higher. At this time, heating conditions preferably include the step of preliminary drying at 60 to 200° C. for 10 minutes to 2 hours, and the step of carrying out a heat treatment under an atmosphere of an inert gas such as nitrogen at 200 to 400° C. for 30 minutes to 5 hours. It is more preferred to vaporize the solvent by heating while ventilation.

A resin film laminate can be formed by laminating the thus obtained resin film and a metal film. As described above, a resin film laminate is obtained by using a metal film as a support when a liquid crystal polyester-containing liquid composition is flow-cast in a film shape, flow-casing a solution in a film shape on the metal film, and then removing the solvent at 50° C. or higher. As described above, a resin film laminate is also obtained by using, as a support, a substrate which does not undergo swelling in a solvent contained in the liquid crystal polyester-containing liquid composition when a liquid crystal polyester-containing liquid composition is flow-cast in a film shape, flow-casting a solution in a film shape on the substrate, removing the solvent at 50° C. or higher, peeling the formed resin film off from the substrate, and then laminating the obtained resin film on the metal film.

Specifically, the resin film laminate can be obtained, for example, by the following methods.

[Method 1]

Method including the steps of flow-casting the liquid crystal polyester-containing liquid composition in a film shape on a metal film (those known as a metal foil can be used) flatly and uniformly by various means such as a roller coating method, a dip coating method, a spray coating method, a spinner coating method, a curtain coating method, a slot coating method or a screen printing method; and then removing a solvent at 50° C. or higher to obtain a laminate of a resin film and a metal film.

[Method 2]

Method including the steps of flow-casting a liquid crystal polyester-containing liquid composition in a film shape on a substrate having a smooth surface, which does not swell in a solvent contained in the liquid crystal polyester-containing liquid composition by the above-mentioned various means; removing a solvent at 50° C. or higher; peeling off from the substrate to obtain a resin film; and laminating the obtained resin film and a metal film (those known as a metal foil can be used) by welding them at about a flow initiation temperature of a liquid crystal polyester contained in the liquid crystal polyester-containing liquid composition using a press or a heat roll.

[Method 3]

Method including the steps of flow-casting a liquid crystal polyester-containing liquid composition into a film shape on a substrate having a flat surface, which does not swell in a solvent contained in the liquid crystal polyester-containing liquid composition, by the above-mentioned various means; removing the solvent at 50° C. or higher; peeling off from the substrate to obtain a resin film; and laminating a metal film on the obtained resin film by a method such as sputtering, plating or vapor deposition.

[Method 4]

Method including the steps of flow-casting a liquid crystal polyester-containing liquid composition into a film shape on a substrate having a flat surface, which does not swell in a solvent contained in the liquid crystal polyester-containing liquid composition, by the above-mentioned various means; removing the solvent at 50° C. or higher; peeling off from the substrate to obtain a resin film; and laminating the obtained resin film and a metal film (those known as a metal foil can be used) using a known adhesive such as a hot melt adhesive.

There is no particular limitation on the thickness of the thus obtained resin film. The thickness is preferably from 0.5 to 200 μm from the viewpoint of film forming properties and mechanical properties, and more preferably from 5 to 75 μm from the viewpoint of handling properties.

The resin film can be optionally subjected to a surface treatment. Examples of the method of the surface treatment include a corona discharge treatment, a flame treatment, a solvent treatment, a UV treatment, a plasma treatment and the like.

In the resin film laminate of the present invention, examples of metal used as the metal film include gold, silver, copper, aluminum, nickel and the like. Among these metals, copper is preferably used. The thickness of the metal film is preferably within a range from 1 to 75 μm, and more preferably from 5 to 50 μm.

[Method for Production of Liquid Crystal Polyester-Impregnated Fiber Sheet]

The method for producing a polyester-impregnated fiber sheet of the present invention is characterized by impregnating a fiber sheet with the liquid crystal polyester-containing liquid composition of the present invention, and then removing a solvent from the liquid crystal polyester-containing liquid composition in the fiber sheet at 50° C. or higher.

Examples of the fiber constituting the fiber sheet include inorganic fibers such as a glass fiber, a carbon fiber and a ceramic fiber; and organic fibers such as a polyester fiber (e.g., liquid crystal polyester fiber, etc.), an aramid fiber and a polybenzazole fiber, and two or more kinds of them may be used. Among these fibers, a glass fiber is preferable.

The fiber sheet may be a textile fabric (woven fabric), a knit fabric or a nonwoven fabric, and is preferably a textile fabric since it is easy to improve dimensional stability of a liquid crystal polyester-impregnated fiber sheet.

The thickness of the fiber sheet is preferably from 10 to 200 μm, more preferably from 10 to 180 μm, and still more preferably from 10 to 100 μm.

Impregnation of the fiber sheet with a liquid crystal polyester-containing liquid composition is typically carried out by immersing the fiber sheet in an immersion tank charged with the liquid crystal polyester-containing liquid composition. It is possible to adjust the amount of the liquid crystal polyester with which the fiber sheet is impregnated by appropriately adjusting the time of the fiber sheet to be impregnated and the rate of taking up the fiber sheet impregnated with the liquid crystal polyester-containing liquid composition from an immersion tank according to the content of the liquid crystal polyester in the liquid crystal polyester-containing liquid composition. The amount of the liquid crystal polyester with which the fiber sheet is impregnated is preferably from 30 to 80% by mass, and more preferably from 40 to 70% by mass, based on the entire mass of the obtained liquid crystal polyester-impregnated fiber sheet.

Then a liquid crystal polyester-impregnated fiber sheet can be obtained by removing the solvent in the liquid crystal polyester-containing liquid composition from the fiber sheet impregnated with the liquid crystal polyester-containing liquid composition. The solvent is removed by heating the fiber sheet impregnated with the liquid crystal polyester-containing liquid composition at 50° C. or higher, and preferably 80° C. or higher. At this time, heating conditions can be adjusted to the same heating conditions as in the method for producing a resin film.

After removing the solvent, a heat treatment may be further carried out. It is possible to further increase the molecular weight of the liquid crystal polyester by this heat treatment. This heat treatment is carried out, for example, under an atmosphere of an inert gas such as nitrogen at 240 to 330° C. for 1 to 30 hours.

It is possible to obtain a liquid crystal polyester-impregnated sheet with a conductor layer by optionally laminating a plurality of the thus obtained liquid crystal polyester-impregnated sheets and then forming the conductor layer on at least one surface of the liquid crystal polyester-impregnated sheet.

The conductor layer may be formed by bonding a metal foil using an adhesive, or laminating through welding using hot pressing. The conductor layer may be formed by coating metal particles using a plating method, a screen printing method, a sputtering method and the like. Examples of the metal constituting metal foil or metal particle include copper, aluminum and silver. Copper is preferably used from the viewpoint of conductivity and cost.

The thus obtained liquid crystal polyester-impregnated fiber sheet with a conductor layer can be suitably used as a printed circuit board including a liquid crystal polyester-impregnated fiber sheet as an insulating layer by forming a predetermined wiring pattern on a conductor layer, and optionally laminating a plurality of the sheets.

EXAMPLES

The present invention will be described more specifically by way of Examples and Comparative Examples, but the present invention is not limited to the following Examples. The flow initiation temperature of the liquid crystal polyester was measured by the following method.
[Measurement of Flow Initiation Temperature of Liquid Crystal Polyester]
Using a flow tester ("Model "CFT-500", manufactured by Shimadzu Corporation), about 2 g of a liquid crystal polyester was filled into a cylinder attached with a die including a nozzle measuring 1 mm in inner diameter and 10 mm in length. Under a load of 9.8 MPa (100 kg/cm$^2$), a liquid crystal polyester was melted while raising a temperature at a rate of 4° C./minute, the molten liquid crystal polyester was extruded through the nozzle and then a temperature, at which a viscosity of 4,800 Pa·s (48,000 poise) is exhibited, was measured.

Production Example 1

Synthesis of Liquid Crystal Polyester

In a reactor equipped with a stirrer, a torque meter, a nitrogen gas introducing tube, a thermometer and a reflux condenser, 658.6 g (3.5 mol) of 6-hydroxy-2-naphthoic acid, 491.3 g (3.25 mol) of 4-hydroxyacetoanilide, 539.9 g (3.25 mol) of isophthalic acid and 791.2 g (7.75 mol) of acetic anhydride were charged. After replacing the gas in the reactor by a nitrogen gas, the temperature was raised from room temperature to 150° C. over 15 minutes under a nitrogen gas flow while stirring and the mixture was refluxed at 150° C. for 3 hours. Then, while distilled off by-produced acetic acid and the unreacted acetic anhydride, the temperature was raised from 150° C. to 300° C. over 3 hours and 50 minutes. At the time when the temperature reaches 300° C., contents were taken out from the reactor and then cooled to room temperature. The obtained solid was crushed by a crusher to obtain a powdered prepolymer. The prepolymer showed a flow initiation temperature of 187° C. Then, the temperature was raised from room temperature to 220° C. over 1 hour and 35 minutes under a nitrogen atmosphere and maintained at 220° C. for 5 hours, thereby subjecting the prepolymer to solid polymerization, followed by cooling to obtain a liquid crystal polyester in a solid form. The obtained solid was crushed by a crusher to obtain a powdered liquid crystal polyester. The liquid crystal polyester showed a flow initiation temperature of 235° C. The temperature was raised from room temperature to 215° C. over 6 hours and 50 minutes under a nitrogen atmosphere and maintained at 215° C. for 5 hours, thereby subjecting the liquid crystal polyester to solid phase polymerization, followed by cooling to obtain a powdered liquid crystal polyester. The liquid crystal polyester showed a flow initiation temperature of 272° C.
(Preparation of Liquid Crystal Polyester Solution)
The liquid crystal polyester (22 g) obtained above was added to 78 g of N,N-dimethylacetamide, followed by stirring at 100° C. for 2 hours under a nitrogen atmosphere to obtain a liquid crystal polyester solution 1.

Production Example 2

Synthesis of Liquid Crystal Polyester

In a reactor equipped with a stirrer, a torque meter, a nitrogen gas introducing tube, a thermometer and a reflux condenser, 941 g (5.0 mol) of 2-hydroxy-6-naphthoic acid, 273 g (2.5 mol) of 4-aminophenol, 415.3 g (2.5 mol) of isophthalic acid and 1,123 g (11 mol) of acetic anhydride were charged. After sufficiently replacing the gas in the reactor by a nitrogen gas, the temperature was raised from room temperature to 150° C. over 15 minutes under a nitrogen gas flow and the mixture was refluxed for 3 hours while maintaining the temperature. Then, while distilled off by-produced acetic acid and the unreacted acetic anhydride, the temperature was raised from 150° C. to 290° C. over 4 hours and 15 minutes. After maintaining at 290° C. for 30 minutes, contents were taken out from the reactor and then cooled to room temperature. The obtained solid was crushed by a crusher to obtain a powdered prepolymer. The prepolymer showed a flow initiation temperature of 181° C. Then, the temperature was raised from room temperature to 250° C. over 6 hours under a nitrogen atmosphere and maintained at 250° C. for 10 hours, thereby subjecting the prepolymer to solid polymerization, followed by cooling to obtain a liquid crystal polyester in a solid form. The obtained solid was crushed by a crusher to obtain a powdered liquid crystal polyester. The liquid crystal polyester showed a flow initiation temperature of 240° C. The temperature was raised from room temperature to 255° C. over 6 hours under a nitrogen atmosphere and maintained at 255° C. for 3 hours, thereby subjecting the liquid crystal polyester to solid phase polymerization, followed by cooling to obtain a powdered liquid crystal polyester. The liquid crystal polyester showed a flow initiation temperature of 325° C.
(Preparation of Liquid Crystal Polyester Solution)
The liquid crystal polyester (8 g) obtained above was added to 92 g of N-methylpyrrolidone, followed by stirring at 140° C. for 4 hours under a nitrogen atmosphere to obtain a liquid crystal polyester solution 2.

Production Example 3

Preparation of Liquid Crystal Polyester Solution

Silica (manufactured by TATSUMORI, LTD. "MP-8FS", volume average particle diameter of 0.5 μm) as a filler was added to the liquid crystal polyester solution 1 produced in Production Example 1 and then dispersed by a centrifugal degasser ("HM-500", manufactured by KEYENCE CORPORATION) to obtain a liquid crystal polyester solution 3. Herein, the use amount of silica was 20% by volume based on the total amount of the liquid crystal polyester and silica.

Example 1

Production of Liquid Composition

BYK307 (polyether-modified polydimethylsiloxane, manufactured by BYK-Chemie) (0.15 part by mass) as a leveling agent was added to 100 parts by mass of the liquid crystal polyester solution 1 produced in Production Example I, followed by stirring at room temperature at 200 rpm for 2 hours to prepare a liquid composition (liquid crystal polyester-containing liquid composition).

[Production of Substrate for Evaluation of Liquid Composition]

An electrolyte copper foil ("3EC-VLP", 18μ, manufactured by MITSUI MINING & SMELTING CO., LTD.) was arranged in an automatic coating machine, Type I (manufactured by Tester Sangyo Co., Ltd.). After setting a film applicator with a micrometer (manufactured by SHEEN) at 350 microns, the liquid composition produced above was applied on a gloss surface of the copper foil to produce a resin film laminate.

[Evaluation of Appearance of Resin Film Laminate]

The thus obtained resin film laminate was dried in a through-air oven at a temperature of 100° C. for 10 minutes and then the surface of the resin film laminate was visually observed. The resin film laminates with no defects were rated "O", whereas, the resin film laminates with defects (pinhole, orange peel, crazing, flow) were rated "x".

[Measurement of Strength of Resin Film]

The thus obtained resin film laminate was immersed in an aqueous ferric chloride solution (Baume degree of 40°, manufactured by KIDA CO., LTD.), thereby etching a copper foil, followed by washing with water to obtain a resin film of a liquid crystal polyester. The tensile strength (maximum point stress) of the resin film obtained in accordance with JIS K 7127 "Plastic—Method for Test of Tensile Properties—The Third Section: Test Conditions of Film and Sheet" was measured under the conditions of room temperature of 23° C. and a testing speed of 5 mm/minute. A ratio of an increase in strength was determined on the basis of the strength of a resin film laminate in which no leveling agent is added.

The results of the evaluation of appearance of the obtained resin film laminate and the measurement of the strength of the resin film are shown in Table 1.

Example 2

In the same operation as in Example 1, except that BYK307 (polyether-modified polydimethylsiloxane, manufactured by BYK-Chemie) as a leveling agent was added in an amount of 0.001 part by mass based on 100 parts by mass of the liquid crystal polyester solution 1, the evaluation of appearance of the obtained resin film laminate and the measurement of the strength of the resin film were carried out. The results are shown in Table 1.

Example 3

In the same operation as in Example 1, except that BYK300 (polyether-modified polydimethylsiloxane, manufactured by BYK-Chemie) as a leveling agent was added in an amount of 0.3 part by mass based on 100 parts by mass of the liquid crystal polyester solution 1, the evaluation of appearance of the obtained resin film laminate and the measurement of the strength of the resin film were carried out. The results are shown in Table 1.

Example 4

In the same operation as in Example 1, except that BYK306 (polyether-modified polydimethylsiloxane, manufactured by BYK-Chemie) as a leveling agent was added in an amount of 0.025 part by mass based on 100 parts by mass of the liquid crystal polyester solution 1, the evaluation of appearance of the obtained resin film laminate and the measurement of the strength of the resin film were carried out. The results are shown in Table 1.

Example 5

In the same operation as in Example 1, except that BYK306 (polyether-modified polydimethylsiloxane, manufactured by BYK-Chemie) as a leveling agent was added in an amount of 0.5 part by mass based on 100 parts by mass of the liquid crystal polyester solution 1, the evaluation of appearance of the obtained resin film laminate and the measurement of the strength of the resin film were carried out. The results are shown in Table 1.

Example 6

In the same operation as in Example 1, except that BYK306 (polyether-modified polydimethylsiloxane, manufactured by BYK-Chemie) as a leveling agent was added in an amount of 0.1 part by mass based on 100 parts by mass of the liquid crystal polyester solution 1, the evaluation of appearance of the obtained resin film laminate and the measurement of the strength of the resin film were carried out. The results are shown in Tables 1 and 2.

Example 7

In the same operation as in Example 1, except that BYK306 (polyether-modified polydimethylsiloxane, manufactured by BYK-Chemie) as a leveling agent was added in an amount of 2.0 parts by mass based on 100 parts by mass of the liquid crystal polyester solution 1, the evaluation of appearance of the obtained resin film laminate and the measurement of the strength of the resin film were carried out. The results are shown in Table 1.

Example 8

In the same operation as in Example 1, except that BYK310 (polyester-modified polydimethylsiloxane, manufactured by BYK-Chemie) as a leveling agent was added in an amount of 0.05 part by mass based on 100 parts by mass of the liquid crystal polyester solution 1, the evaluation of appearance of the obtained resin film laminate and the measurement of the strength of the resin film were carried out. The results are shown in Table 1.

Example 9

In the same operation as in Example 1, except that BYK307 (polyester-modified polydimethylsiloxane, manufactured by BYK-Chemie) as a leveling agent was added in an amount of 0.002 part by mass based on 100 parts by mass of the liquid crystal polyester solution 1, the evaluation of appearance of the obtained resin film laminate and the measurement of the strength of the resin film were carried out. The results are shown in Table 1.

Example 10

In the same operation as in Example 1, except that BYK340 (fluorine-modified polymer, manufactured by BYK-Chemie) as a leveling agent was added in an amount of 0.1 part by mass based on 100 parts by mass of the liquid crystal polyester solution 1, the evaluation of appearance of the obtained resin film laminate and the measurement of the strength of the resin film were carried out. The results are shown in Table 1.

Example 11

In the same operation as in Example 1, except that BYK333 (polyether-modified polydimethylsiloxane, manufactured by BYK-Chemie) as a leveling agent was added in an amount of 0.3 part by mass based on 100 parts by mass of the liquid crystal polyester solution 1, the evaluation of appearance of the obtained resin film laminate and the measurement of the strength of the resin film were carried out. The results are shown in Table 1.

Example 12

In the same operation as in Example 1, except that BYK333 (polyether-modified polydimethylsiloxane, manufactured by BYK-Chemie) as a leveling agent was added in an amount of 0.002 part by mass based on 100 parts by mass of the liquid crystal polyester solution 1, the evaluation of appearance of the obtained resin film laminate and the measurement of the strength of the resin film were carried out. The results are shown in Table 1.

Example 13

In the same operation as in Example 1, except that BYK331 (polyether-modified polydimethylsiloxane, manufactured by BYK-Chemie) as a leveling agent was added in an amount of 0.001 part by mass based on 100 parts by mass of the liquid crystal polyester solution 1, the evaluation of appearance of the obtained resin film laminate and the measurement of the strength of the resin film were carried out. The results are shown in Table 1.

Example 14

In the same operation as in Example 1, except that BYK331 (polyether-modified polydimethylsiloxane, manufactured by BYK-Chemie) as a leveling agent was added in an amount of 0.002 part by mass based on 100 parts by mass of the liquid crystal polyester solution 1, the evaluation of appearance of the obtained resin film laminate and the measurement of the strength of the resin film were carried out. The results are shown in Table 1.

Example 15

In the same operation as in Example 1, except that BYK340 (fluorine-modified polymer, manufactured by BYK-Chemie) as a leveling agent was added in an amount of 2.0 parts by mass based on 100 parts by mass of the liquid crystal polyester solution 2 produced in Production Example 2, the evaluation of appearance of the obtained resin film laminate and the measurement of the strength of the resin film were carried out. The results are shown in Table 1.

Example 16

In the same operation as in Example 1, except that BYK306 (polyether-modified polydimethylsiloxane, manufactured by BYK-Chemie) as a leveling agent was added in an amount of 2.0 parts by mass based on 100 parts by mass of the liquid crystal polyester solution 2 produced in Production Example 2, the evaluation of appearance of the obtained resin film laminate and the measurement of the strength of the resin film were carried out. The results are shown in Table 1.

Comparative Example 1

In the same operation as in Example 1, except that no leveling agent was added to the liquid crystal polyester solution 1, the evaluation of appearance of the obtained resin film laminate and the measurement of the strength of the resin film were carried out. The results are shown in Tables 1 and 2.

Comparative Example 2

In the same operation as in Example 15, except that no leveling agent was added to the liquid crystal polyester solution 2, the evaluation of appearance of the obtained resin film laminate and the measurement of the strength of the resin film were carried out. The results are shown in Table 1.

Comparative Example 3

In the same operation as in Example 1, except that BYK306 (polyether-modified polydimethylsiloxane, manufactured by BYK-Chemie) as a leveling agent was added in an amount of 5.0 parts by mass based on 100 parts by mass of the liquid crystal polyester solution 1, the evaluation of appearance of the obtained resin film laminate and the measurement of the strength of the resin film were carried out. The results are shown in Table 1.

Comparative Example 4

In the same operation as in Example 1, except that BYK350 (acrylic polymer, manufactured by BYK-Chemie) as a leveling agent was added in an amount of 1.0 part by mass based on 100 parts by mass of the liquid crystal polyester solution 1, the evaluation of appearance of the obtained resin film laminate and the measurement of the strength of the resin film were carried out. The results are shown in Table 1.

Comparative Example 5

In the same operation as in Example 1, except that BYK361N (acrylic polymer, manufactured by BYK-Chemie) as a leveling agent was added in an amount of 0.5 part by mass based on 100 parts by mass of the liquid crystal polyester solution 1, the evaluation of appearance of the obtained resin film laminate and the measurement of the strength of the resin film were carried out. The results are shown in Table 1.

TABLE 1

| | Additives | Trade name | Solution | Parts by mass | Drying temperature ° C. | Surface appearance | Maximum point stress MPa | Stress increase ratio Times |
|---|---|---|---|---|---|---|---|---|
| Example 1 | Polyether-modified polydimethylsiloxane | BYK-307 | Production Example 1 | 0.15 | 100 | ○ | 89 | 1.10 |
| Example 2 | | | | 0.001 | | ○ | 106 | 1.31 |
| Example 3 | Polyether-modified polydimethylsiloxane | BYK-300 | | 0.3 | | ○ | 90 | 1.11 |
| Example 4 | Polyether-modified polydimethylsiloxane | BYK-306 | | 0.025 | | ○ | 89 | 1.10 |
| Example 5 | | | | 0.5 | | ○ | 92 | 1.14 |
| Example 6 | | | | 0.1 | | ○ | 90 | 1.11 |
| Example 7 | | | | 2.0 | | ○ | 84 | 1.04 |
| Example 8 | polyester-modified polydimethylsiloxane | BYK-310 | | 0.05 | | ○ | 86 | 1.06 |
| Example 9 | | | | 0.002 | | ○ | 107 | 1.32 |
| Example 10 | Fluorine-modified polymer | BYK-340 | | 0.1 | | ○ | 91 | 1.12 |
| Example 11 | Polyether-modified Polydimethylsiloxane | BYK-333 | | 0.3 | | ○ | 87 | 1.07 |
| Example 12 | | | | 0.002 | | ○ | 105 | 1.30 |
| Example 13 | Polyether-modified polydimethylsiloxane | BYK-331 | | 0.001 | | ○ | 97 | 1.20 |
| Example 14 | | | | 0.002 | | ○ | 102 | 1.26 |
| Example 15 | Fluorine-modified polymer | BYK-340 | Production Example 2 | 2.0 | | ○ | 130 | 1.33 |
| Example 16 | Polyether-modified polydimethylsiloxane | BYK-306 | | 2.0 | | ○ | 104 | 1.06 |
| Comparative Example 1 | No addition | | Production Example 1 | 0 | | X | 81 | 1.00 |
| Comparative Example 2 | No addition | | Production Example 2 | 0 | | X | 98 | 1.00 |
| Comparative Example 3 | Polyether-modified polydimethylsiloxane | BYK-306 | Production Example 1 | 5.0 | | X | 70 | 0.86 |
| Comparative Example 4 | Acrylic copolymer | BYK-350 | | 1.0 | | X | 55 | 0.68 |
| Comparative Example 5 | Acrylic copolymer | BYK-361N | | 0.5 | | X | 74 | 0.91 |

As a result, in the resin film laminates obtained from the liquid composition in which no leveling agent is added, defects were observed on the surface. In contrast, in the resin film laminate obtained from a liquid composition in which a polyether-modified polydimethylsiloxane, a polyester-modified polydimethylsiloxane or a fluorine-modified polymer as a leveling agent was added in an amount of 0.001 to 2.0 parts by mass based on 100 parts by mass of the liquid crystal polyester solution, defects were not observed on the surface and surface appearance was satisfactory, and also the tensile strength of the resin film itself increased as compared with those in which no leveling agent was added. In contrast, in the resin film laminate obtained from the liquid composition in which the polyether-modified polydimethylsiloxane was added in a large amount of 5.0 parts by mass based on 100 parts by mass of the liquid crystal polyester solution, defects were observed on the surface and the surface modification effect could not be obtained, and also the tensile strength of the resin film itself was lower compared with those in which no leveling agent is added (Comparative Example 3). In the resin film laminates obtained from the liquid composition in which an acrylic copolymer was used as the leveling agent, defects were observed on the surface, and also the tensile strength of the resin film itself was low (Comparative Examples 4 and 5). As is apparent from the above results, a resin film having excellent surface appearance and mechanical strength is obtained from the liquid composition by adding a specific kind of leveling agent to a liquid composition containing a liquid crystal polyester and an organic solvent so that the concentration falls within a specific range even in case of removing the solvent at a high temperature in the film forming step.

Example 17

In the same operation as in Example 6, except that the drying temperature of the resin film laminate was changed to 50° C. in the evaluation of appearance of the resin film laminate, the evaluation of appearance of the obtained resin film laminate was carried out. The results are shown in Table 2.

Example 18

In the same operation as in Example 6, except that the drying temperature of the resin film laminate was changed to 200° C. in the evaluation of appearance of the resin film laminate, the evaluation of appearance of the obtained resin film laminate was carried out. The results are shown in Table 2.

Comparative Example 6

In the same operation as in Comparative Example 1, except that the drying temperature of the resin film laminate was changed to 50° C. in the evaluation of appearance of the resin film laminate, the evaluation of appearance of the obtained resin film laminate was carried out. The results are shown in Table 2.

Comparative Example 7

In the same operation as in Comparative Example 1, except that the drying temperature of the resin film laminate was changed to 200° C. in the evaluation of appearance of the resin film laminate, the evaluation of appearance of the obtained resin film laminate was carried out. The results are shown in Table 2.

TABLE 2

| | Additives | Trade name | Solution | Parts by mass | Drying temperature ° C. | Surface appearance |
|---|---|---|---|---|---|---|
| Example 6 | Polyether-modified polydimethylsiloxane | BYK-306 | Production Example 1 | 0.1 | 100 | ○ |
| Example 17 | | | | | 50 | ○ |
| Example 18 | | | | | 200 | ○ |
| Comparative Example 1 | No addition | | | 0 | 100 | X |
| Comparative Example 6 | | | | | 50 | X |
| Comparative Example 7 | | | | | 200 | X |

As a result, similar to Example 6, in both resin film laminates obtained in Examples 17 and 18, defects were not observed on the surface and surface appearance was satisfactory. In contrast, in the resin film laminates obtained in Comparative Example 6 and 7 in which no leveling agent is added, defects were observed similar to Comparative Example 1. As is apparent from the above results, a resin film having excellent surface appearance and mechanical strength is obtained from the liquid composition by adding a specific kind of leveling agent to a liquid composition containing a liquid crystal polyester and an organic solvent so that the concentration falls within a specific range even in case of removing the solvent at 50° C. or higher in the film forming step.

Example 19

In the same operation as in Example 6, except that the liquid, crystal polyester solution 3 produced in Production Example 3 was used in place of the liquid crystal polyester solution 1, the evaluation of appearance of the obtained resin film laminate was carried out. The results are shown in Table 3.

Comparative Example 8

In the same operation as in Example 19, except that no leveling agent was added to the liquid crystal polyester solution 3, the evaluation of appearance of the obtained resin film laminate was carried out. The results are shown in Table 3.

TABLE 3

| | Additives | Trade name | Solution | Parts by mass | Drying temperature ° C. | Surface appearance |
|---|---|---|---|---|---|---|
| Example 19 | Polyether-modified polydimethylsiloxane | BYK-306 | Production Example 3 | 0.1 | 100 | ○ |
| Comparative Example 8 | No addition | | | 0 | | X |

As a result, in the resin film laminate obtained in Example 19 in which a liquid crystal polyester solution containing silica is used, defects were not observed on the surface and surface appearance was satisfactory similar to Example 6 in which a liquid crystal polyester solution containing no silica is used. As is apparent from the above results, even in case of removing the solvent at 50° C. or higher in the film forming step from the liquid crystal polyester-containing liquid composition of the present invention, a resin film having excellent surface appearance and mechanical strength is obtained from the liquid composition, regardless of the presence or absence of other additives.

As described above, it is possible to produce a resin film or liquid crystal polyester-impregnated fiber sheet having excellent surface appearance and tensile strength by using the liquid crystal polyester-containing liquid composition of the present invention. Therefore, the liquid crystal polyester-containing liquid composition of the present invention can be widely applied to a printed circuit board (regardless of a multi-layered type or a single-layered type printed circuit board) used for various communication, power supply and in-vehicle purposes.

What is claimed is:

1. A liquid crystal polyester-containing liquid composition comprising a liquid crystal polyester, an organic solvent, and one or more kinds of leveling agents selected from the group consisting of a polyether-modified polydimethylsiloxane, a fluorine-modified polymer and a polyester-modified polydimethylsiloxane, wherein the content of the leveling agent is from 0.001 to 2.0 parts by mass based on 100 parts by mass of the total amount of the liquid crystal polyester and the organic solvent.

2. The liquid crystal polyester-containing liquid composition according to claim 1, wherein the liquid crystal polyester includes a repeating unit represented by the following formula (1), a repeating unit represented by the following formula (2) and a repeating unit represented by the following formula (3):

(1)

(2)

(3)

wherein $Ar^1$ represents a phenylene group, a naphthylene group or a biphenylylene group; $Ar^2$ and $Ar^3$ each independently represents a phenylene group, a naphthylene group, a biphenylylene group or a group represented by the following formula (4); X and Y each independently represents an oxygen atom or an imino group; and hydrogen atoms existing in the group represented by $Ar^1$, $Ar^2$ or $Ar^3$ each independently may be substituted with a halogen atom, an alkyl group or an aryl group, and

$$-Ar^4-Z-Ar^5- \quad (4)$$

wherein $Ar^4$ and $Ar^5$ each independently represents a phenylene group or a naphthylene group;

and Z represents an oxygen atom, a sulfur atom, a carbonyl group, a sulfonyl group or an alkylidene group.

3. The liquid crystal polyester-containing liquid composition according to claim 2, wherein the liquid crystal polyester includes 30 to 80 mol % of a repeating unit represented by the formula (1), 10 to 35 mol % of a repeating unit represented by the formula (2) and 10 to 35 mol % of a repeating unit represented by the formula (3), based on the total amount of all repeating units constituting the liquid crystal polyester.

4. The liquid crystal polyester-containing liquid composition according to claim 2, wherein X and/or Y is/are imino group(s).

5. The liquid crystal polyester-containing liquid composition according to claim 1, wherein the organic solvent is an aprotic solvent.

6. The liquid crystal polyester-containing liquid composition according to claim 5, wherein the aprotic solvent is an aprotic solvent having no halogen atom.

7. The liquid crystal polyester-containing liquid composition according to claim 5, wherein the aprotic solvent is an amide-based solvent.

8. The liquid crystal polyester-containing liquid composition according to claim 1, wherein the content of the liquid crystal polyester is from 10 to 50% by mass based on the total amount of the liquid crystal polyester and the organic solvent.

9. The liquid crystal polyester-containing liquid composition according to claim 1, wherein the one or more leveling agents comprises a fluorine-modified polymer.

10. A method for producing a resin film, which comprises applying the liquid crystal polyester-containing liquid composition according to claim 1 on a support, and then removing the solvent from the liquid crystal polyester-containing liquid composition on the support at 50° C. or higher.

11. A method for producing a liquid crystal polyester-impregnated fiber sheet, which comprises impregnating a fiber sheet with the liquid crystal polyester-containing liquid composition according to claim 1, and then removing the solvent from the liquid crystal polyester-containing liquid composition in the fiber sheet at 50° C. or higher.

* * * * *